(12) United States Patent
Chen et al.

(10) Patent No.: US 12,506,088 B2
(45) Date of Patent: Dec. 23, 2025

(54) SEAL RING STRUCTURES

(71) Applicant: Taiwan Semiconductor Manufacturing Company, Ltd., Hsinchu (TW)

(72) Inventors: Chun Yu Chen, Hsinchu (TW); Yen Lian Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 798 days.

(21) Appl. No.: 17/581,251

(22) Filed: Jan. 21, 2022

(65) Prior Publication Data
US 2023/0029241 A1 Jan. 26, 2023

Related U.S. Application Data

(60) Provisional application No. 63/224,602, filed on Jul. 22, 2021.

(51) Int. Cl.
*H01L 23/00* (2006.01)
*H01L 23/58* (2006.01)

(52) U.S. Cl.
CPC .......... *H01L 23/562* (2013.01); *H01L 23/564* (2013.01); *H01L 23/585* (2013.01)

(58) Field of Classification Search
None
See application file for complete search history.

(56) References Cited

U.S. PATENT DOCUMENTS

| 10,727,218 | B2 | 7/2020 | Wu et al. |
| 2006/0055007 | A1 | 3/2006 | Yao |
| 2007/0069336 | A1 | 3/2007 | Ning |
| 2009/0189245 | A1 | 7/2009 | Furusawa |
| 2015/0021713 | A1 | 1/2015 | Cheng |

(Continued)

FOREIGN PATENT DOCUMENTS

| CN | 1701418 A | 11/2005 |
| CN | 101339924 A | 1/2009 |

(Continued)

OTHER PUBLICATIONS

Chun Yu Chen et al., Seal Structures, U.S. Appl. No. 17/465,556, filed Sep. 2, 2021, Assignee: Taiwan Semiconductor Manufacturing Company, Ltd., 32 pages specification, 13 pages drawings.

*Primary Examiner* — Bo B Jang
(74) *Attorney, Agent, or Firm* — HAYNES AND BOONE, LLP

(57) ABSTRACT

Integrated circuit (IC) chips and seal ring structures are provided. An IC chip according to the present disclosure includes a substrate and a first interconnect layer over the substrate. The first interconnect layer includes a first device region and a first ring region surrounding the first device region. The first ring region includes a first wall fully surrounding the first device region and a second wall fully surrounding the first device region and the first wall. The first wall is spaced apart from the second wall by a first intermetal dielectric layer and at least one first dummy metal line along an edge of the first device region. The first wall is spaced apart from the second wall only by the first intermetal dielectric layer around a corner of the first device region.

20 Claims, 10 Drawing Sheets

(56) References Cited

U.S. PATENT DOCUMENTS

| | | | |
|---|---|---|---|
| 2015/0364463 A1* | 12/2015 | Suzuki | ............... H01L 27/0255 257/355 |
| 2019/0067216 A1 | 2/2019 | Zhu | |
| 2019/0237414 A1 | 8/2019 | Baek | |

FOREIGN PATENT DOCUMENTS

| | | |
|---|---|---|
| CN | 102376654 A | 3/2012 |
| CN | 104009024 A | 8/2014 |
| TW | 202111887 A | 3/2021 |

* cited by examiner

SEAL RING STRUCTURES

PRIORITY DATA

This application claims priority to U.S. Provisional Patent Application Ser. No. 63/224,602, filed Jul. 22, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Due to the scaling down, the structures of the FinFETs or MBC transistors may be susceptible to damages due to mist ingress or stress during singulation. Seal structures have been implemented to protect semiconductor devices. While existing seal structures are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
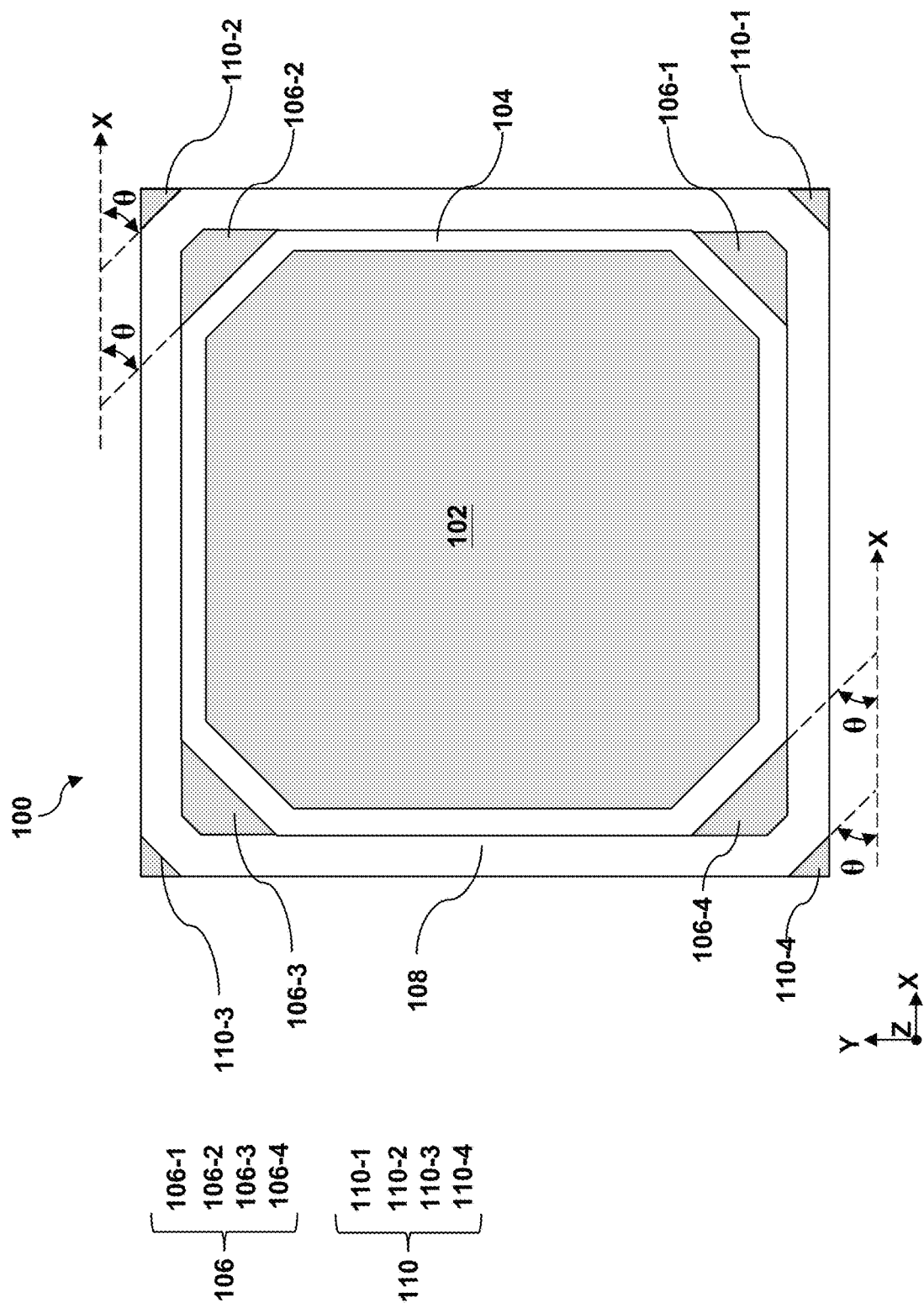
FIG. 1 illustrates a top view of a substrate, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed. For avoidance of doubts, the X, Y and Z directions in figures of the present disclosure are perpendicular to one another. Throughout the present disclosure, like reference numerals denote like features, unless otherwise excepted.

Seal structures are used to prevent semiconductor devices in an integrated circuit (IC) chip from being damaged due to mist ingress or stress during singulation of the IC chip. Multi-gate devices, such as FinFETs and MBC transistors, emerge as the industry moves toward smaller device nodes. While FinFETs and MBC transistors improve gate control and short channel effects, they are not immune from damages from water and stress. In fact, due to their delicate dimensions and structures, they may be more prone to damages without adequate seal structures. In some existing technologies, seal ring structures are not only present in the front-end-of-line (FEOL) and the middle-end-of-line (MEOL) structures but also in back-end-of-line (BEOL). As used herein, FEOL structures include structural features of transistors or other semiconductor devices fabricated on a semiconductor substrate; MEOL structures include source/drain contact vias or gate contact vias; and BEOL structure include interconnect structures. Pattern densities across various metal layers in an interconnect structure are important in preventing dishing or uneven surfaces when the interconnect structure or its precursor is subject to planarization processes. When the pattern density in a metal layer is not substantially uniform, dishing may appear in areas with smaller local densities. However, it is also observed that when pattern densities in an interconnect structure are uniform, the seal ring structures may not sufficiently absorb stress, leading to undesirable damages to the IC chip.

The present disclosure provides embodiments of an IC chip that includes stress absorption structures in its seal ring structure. According to embodiments of the present disclosure, the IC chip includes a substrate and an interconnect structure disposed on the substrate. The substrate includes a device region, an inner ring surrounding the device region, an outer ring surrounding the inner ring. The interconnect structure over the substrate also includes portions vertically corresponding to the regions in the substrate. Portions of the interconnect structure disposed directly over the inner ring and the outer ring include a plurality of seal ring walls. While dummy metal bars may be inserted between seal ring walls to provide a uniform pattern density, they are intentionally omitted from corner areas to provide stress absorption.

Reference is first made to FIG. 1, which is a top view of substrate 100. The substrate 100 includes a device region 102, an inner ring 104 continuously surrounding the device region 102, an outer ring 108 continuously surrounding the inner ring 104, four inner corner areas 106 disposed between outer corners of the inner ring 104 and the inner corners of the outer ring 108, four outer corner areas 110 disposed at outer corners of the outer ring 108. The inner corner areas 106 includes a first inner corner area 106-1, a second inner corner area 106-2, a third inner corner area 106-3, and a fourth inner corner area 106-4. For ease of reference, the first inner corner area 106-1, the second inner corner area 106-2, the third inner corner area 106-3, and the fourth inner corner area 106-4 may be collectively or respectively referred to as inner corner areas 106 or an inner corner area 106 as the context requires. The outer corner area 110 includes a first outer corner area 110-1, a second outer corner area 110-2, a third outer corner area 110-3, and a fourth outer corner area 110-4. For ease of reference, the first outer corner area 110-1, the second outer corner area 110-2, the third outer corner area 110-3, and the fourth outer corner area 110-4 may be collectively or respectively referred to as outer corner areas 110 or an outer corner area 110 as the context requires. The substrate 100 may be rectangular in shape when viewed along the Z direction. In these embodiments, each of the inner corner areas 106 resembles a right triangle that has the right-angle vertex clipped off and each of the outer corner areas 110 is a right triangle. In the embodiments represented in FIG. 1, each of the right triangles in the inner corner areas 106 or the outer corner areas 110 is an isosceles triangle. In other words, the hypotenuse of each of the outer corner areas 110 forms an angle θ with the X direction or the Y direction. The angle θ is 45°. Each of the inner ring 104 and the outer ring 108 is substantially rectangular with four corners.

In some embodiments, the substrate 100 may be a bulk silicon (Si) substrate. Alternatively, substrate 100 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 100 includes one or more group III-V materials, one or more group II-VI materials, or combinations thereof. In still some instances, the substrate 100 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 100 may be diamond substrate or a sapphire substrate.

The substrate 100 may include various semiconductor structures, such as active regions, gate structures disposed over channel regions of the active regions, source/drain features disposed over source/drain regions of the active regions, source/drain contacts disposed over source/drain features, and gate contact vias disposed over the gate structures. The active regions may include silicon (Si) or a suitable semiconductor material. Each of the segmented gate structures includes a gate dielectric layer and a gate electrode layer over the gate dielectric layer. In some embodiments, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the segmented gate structures may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

Source/drain features may include silicon (Si) doped with an n-type dopant, such as phosphorus (P) or arsenic (As) or silicon germanium (SiGe) doped with a p-type dopant, such as boron (B) or boron difluoride ($BF_2$). The sourced/drain contacts may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The metal fill layer may include ruthenium (Ru), copper (Cu), nickel (Ni), cobalt (Co), or tungsten (W).

Figure 2:
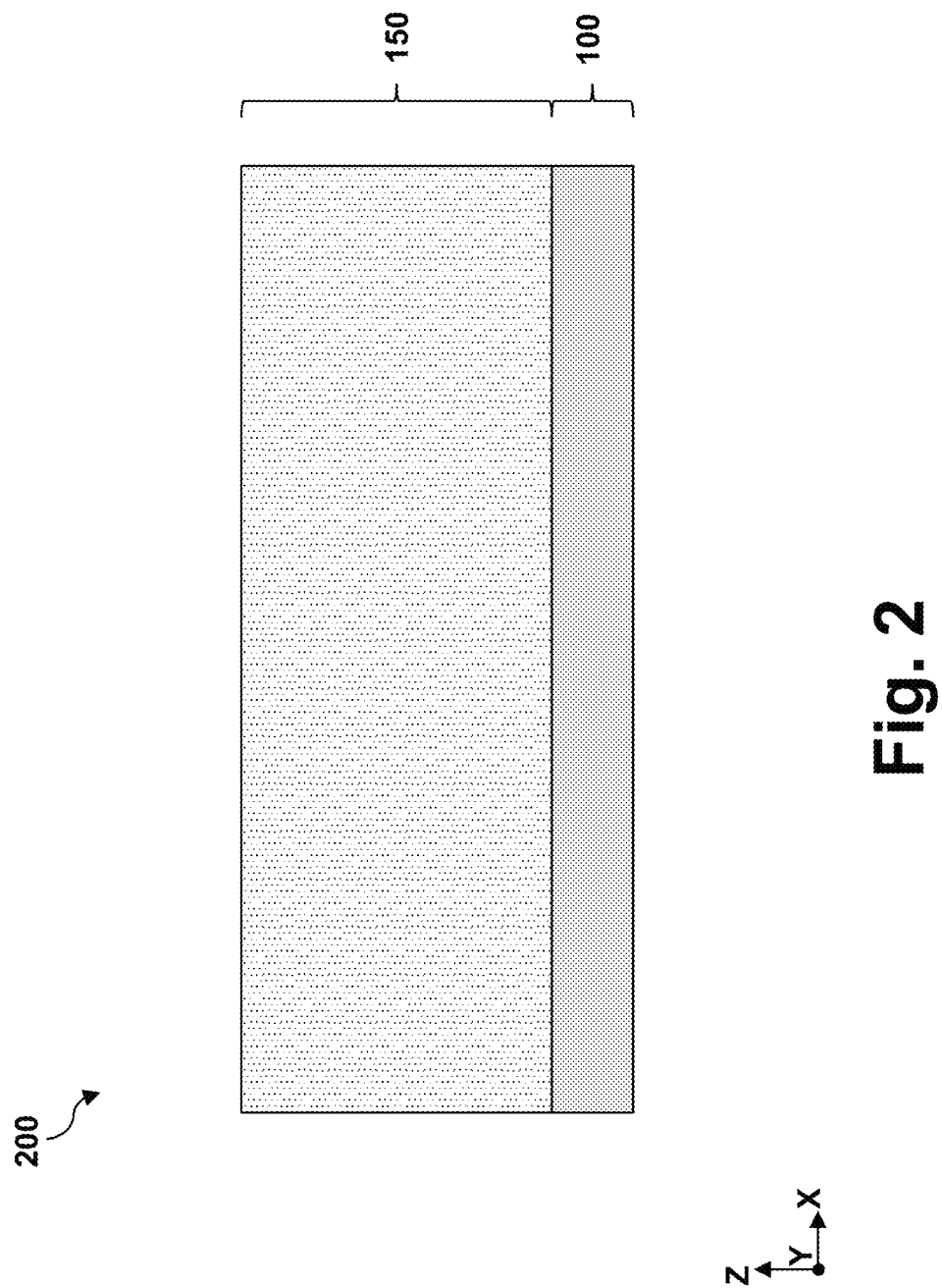
FIG. 2 illustrates a cross-sectional view of an interconnect structure disposed on the substrate in FIG. 1, according to one or more aspects of the present disclosure.

FIG. 2 illustrates a cross-sectional view of an interconnect structure 150 disposed on the substrate 100 in FIG. 1. The interconnect structure 150 may include more than 9 metal line layers, such as between 10 metal layers and 14 metal layers. Each of the metal layers includes conductive lines embedded in an intermetal dielectric (IMD) layer. The interconnect structures 150 also includes contact vias that vertically interconnect conductive lines in different metal layers. The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials. The conductive lines and contact vias may include copper (Cu), titanium nitride (TiN), tungsten (W), or ruthenium (Ru). The interconnect structure 150 functionally connects transistors or semiconductor devices in the substrate 100. The interconnect structure 150 and the substrate 100 may be collectively referred to as an integrated circuit (IC) chip.

The semiconductor structures in the substrate 100 form transistors, such as planar transistors or multi-gate transistors. Examples of multi-gate transistors may include fin-like field effect transistors (FinFETs) and multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. When transistors in the substrate 100 are planar transistors, the active regions may include semiconductor features embedded in a dielectric layer. When transistors in the substrate 100 are FinFETs, the active regions may include fin-like semiconductor structures rising above an isolation feature and the gate structures are disposed over the fin-like semiconductor structures to engage two or three surfaces of the fin-like semiconductor structures. When transistors in the substrate 100 are MBC transistors, the active regions may each include a vertical stack of nanostructures and the gate structure wraps around each of nanostructures in the vertical stack of nanostructures. The nanostructures may have different cross-sections. In some instances, the nanostructures have a width substantially similar to its thickness and may be referred to as nanowires. In some other instances, the nanostructures have a width greater than to its thickness and may be referred to as nanosheets.

Figure 3:
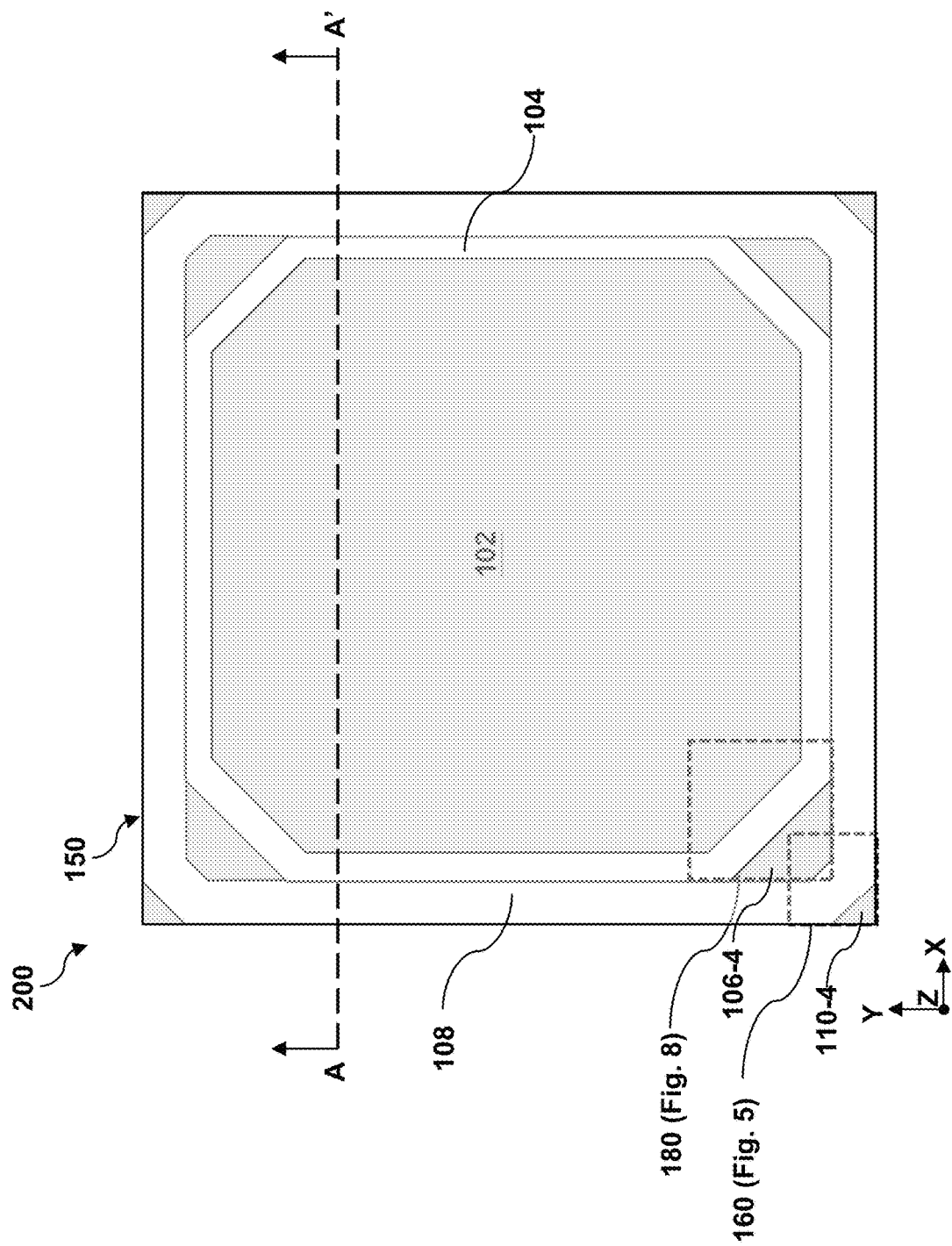
FIG. 3 illustrates a top view of an interconnect structure disposed on the substrate in FIG. 1, according to one or more aspects of the present disclosure.
Figure 5:
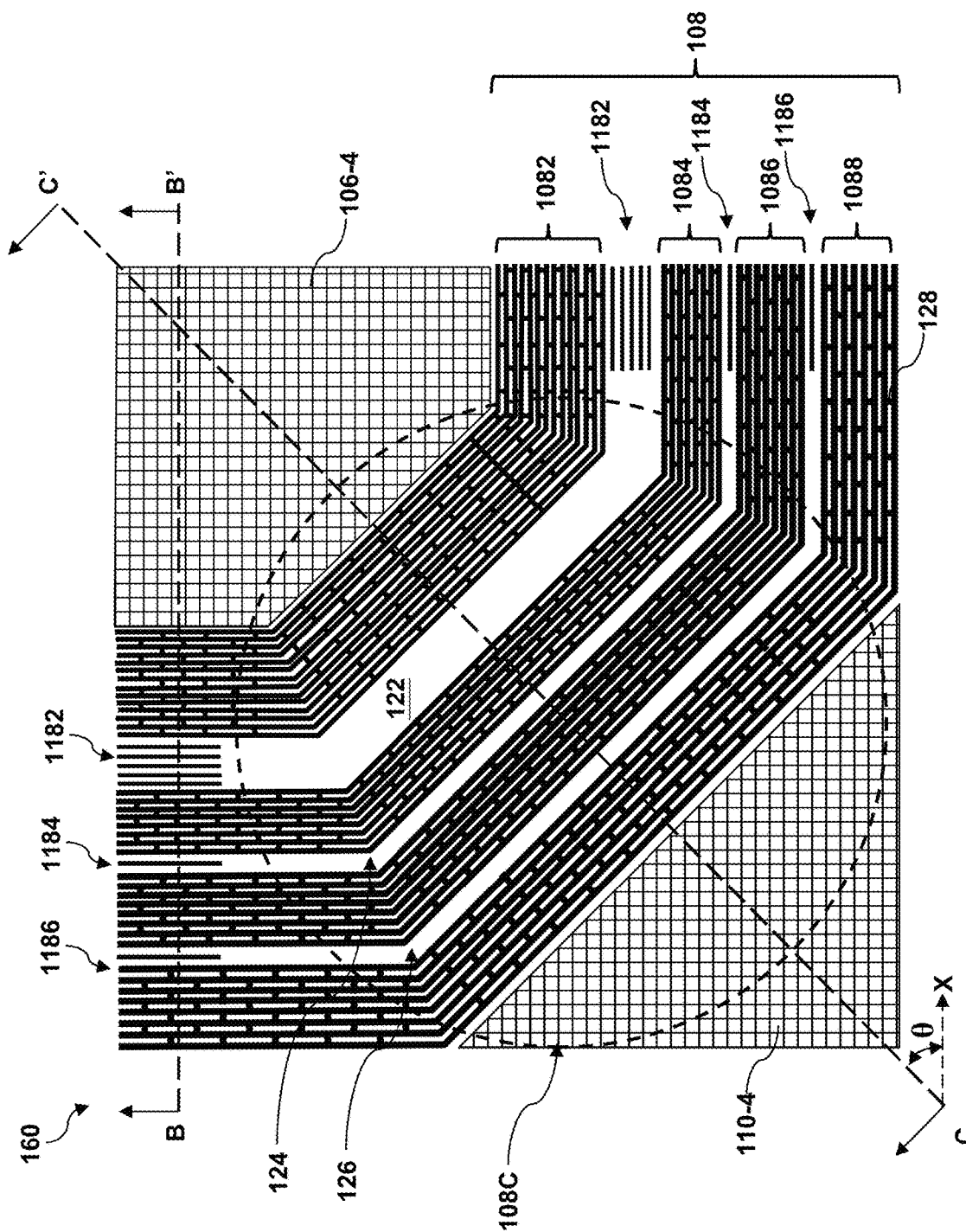
FIG. 5 illustrates an enlarged fragmentary top view of a portion of the interconnect structure disposed over an outer corner area of the substrate in FIG. 1, according to one or more aspects of the present disclosure.
Figure 6:
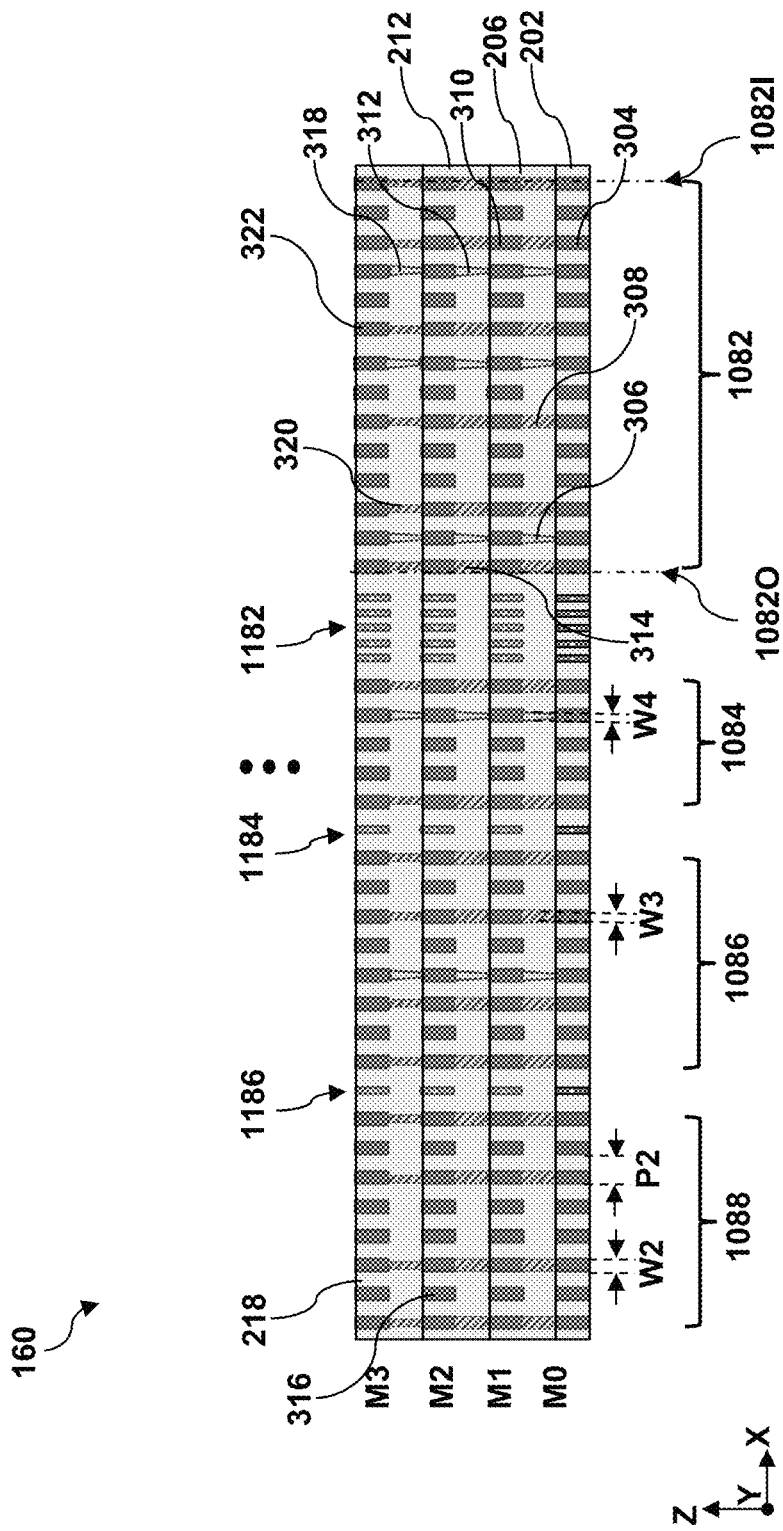
FIG. 6 illustrates an enlarged fragmentary cross-sectional view of a portion of the interconnect structure disposed over the outer corner area of the substrate in FIG. 1, according to one or more aspects of the present disclosure.
Figure 7:
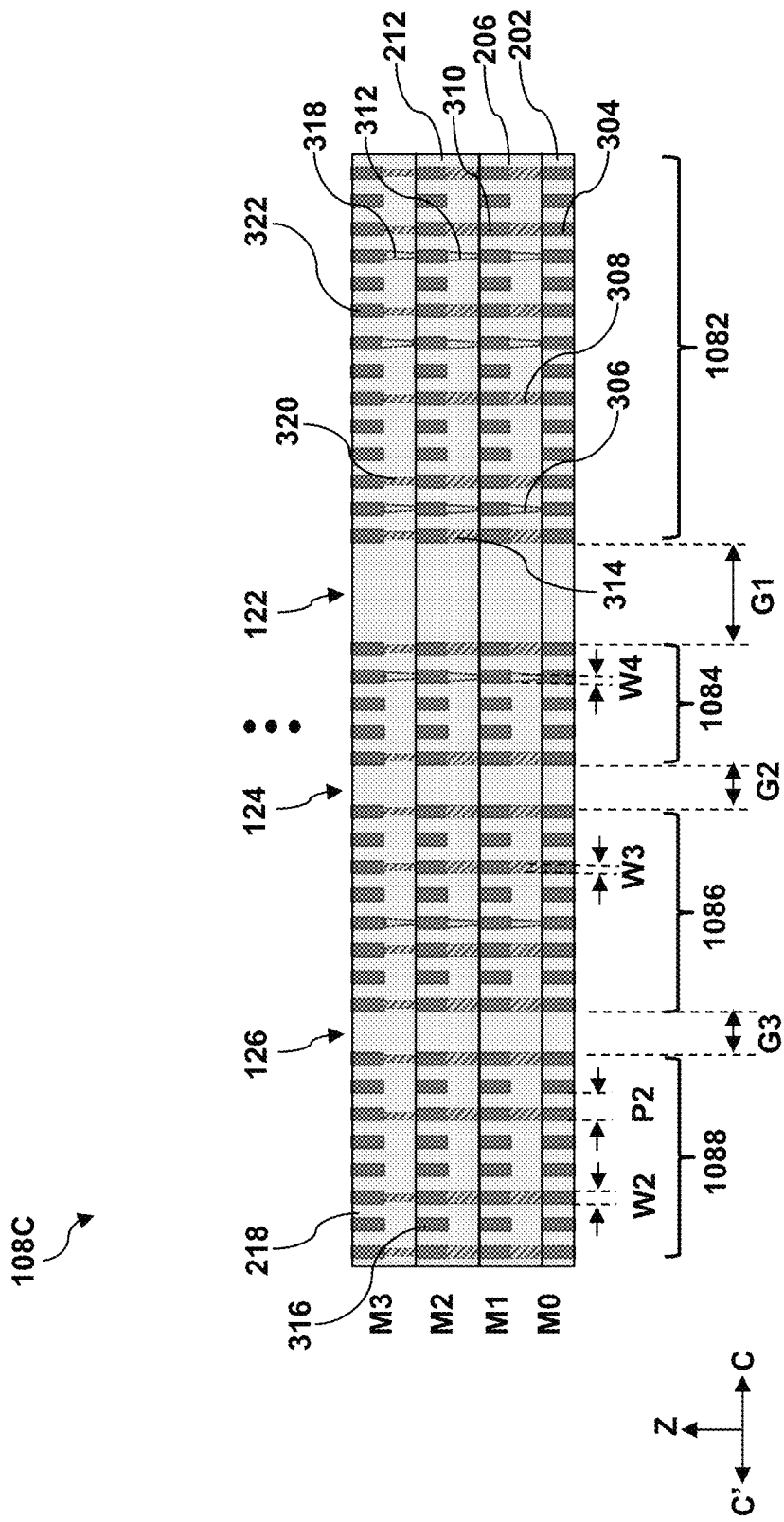
FIG. 7 illustrates an enlarged fragmentary cross-sectional view of a portion of the interconnect structure disposed over the outer corner area of the substrate in FIG. 1, according to one or more aspects of the present disclosure.
Figure 8:
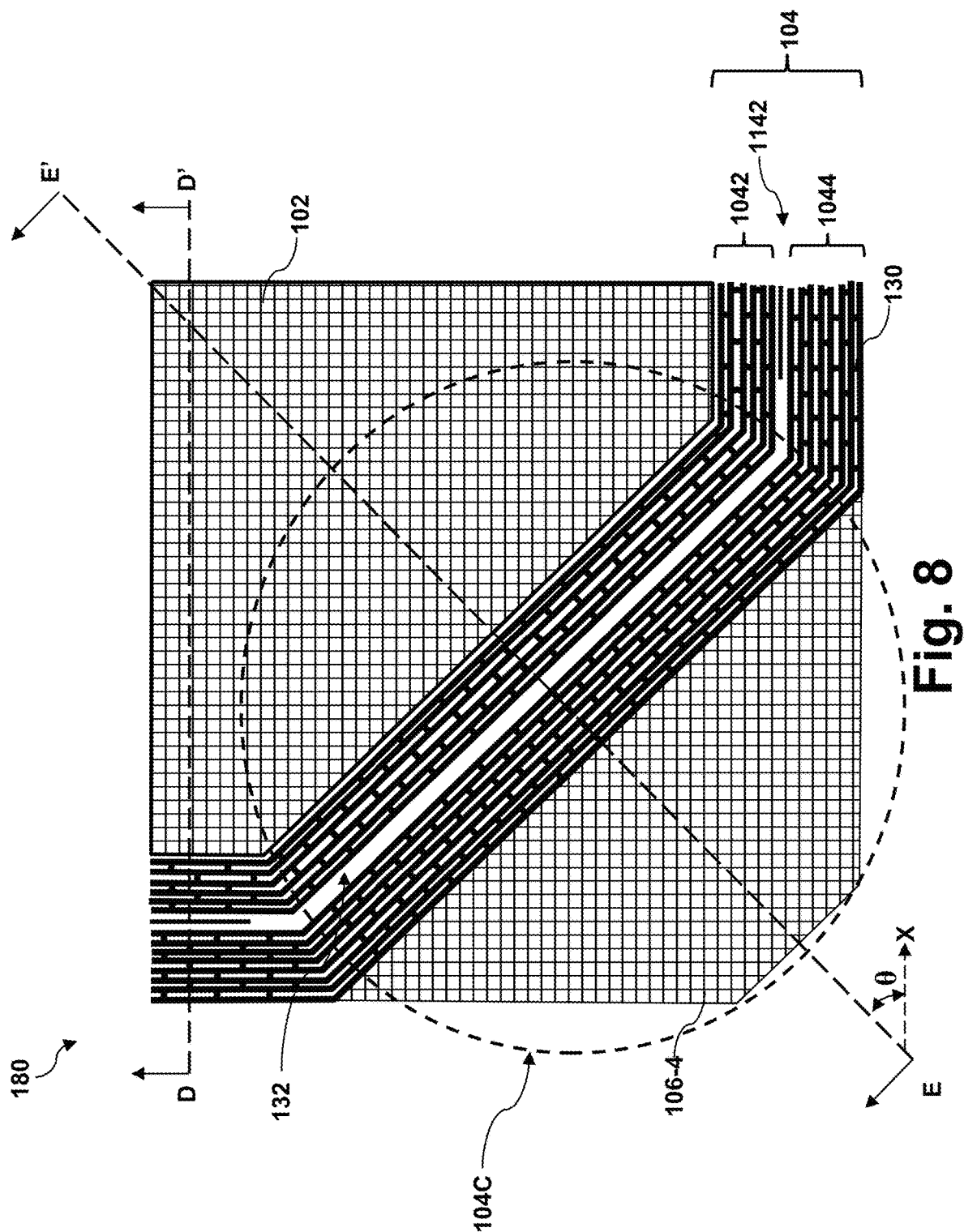
FIG. 8 illustrates an enlarged fragmentary top view of a portion of the interconnect structure disposed over an inner corner area of the substrate in FIG. 1, according to one or more aspects of the present disclosure.
Figure 9:
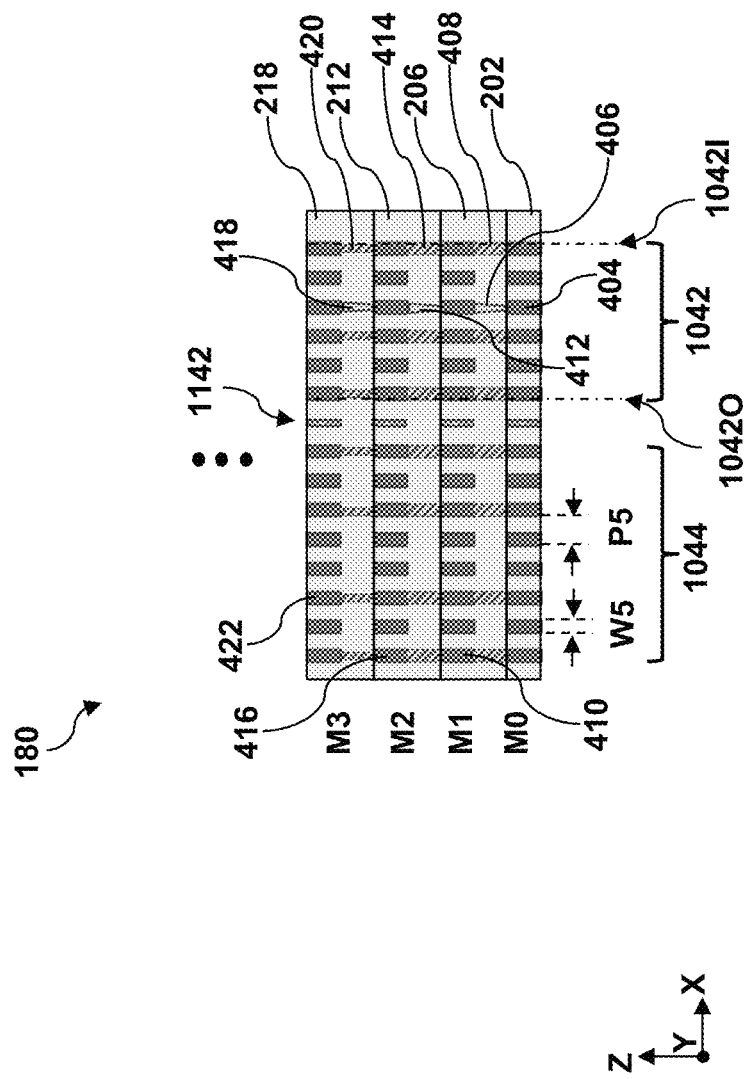
FIG. 9 illustrates an enlarged fragmentary cross-sectional view of a portion of the interconnect structure disposed over the inner corner area of the substrate in FIG. 1, according to one or more aspects of the present disclosure.
Figure 10:
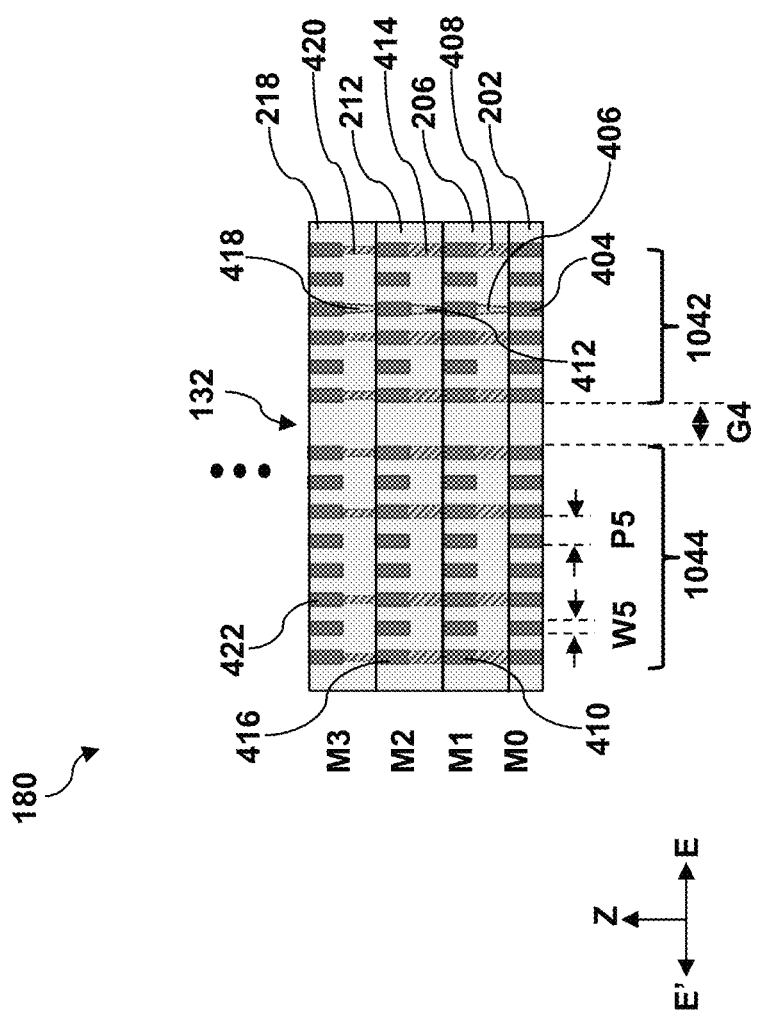
FIG. 10 illustrates an enlarged fragmentary cross-sectional view of a portion of the interconnect structure disposed over the inner corner area of the substrate in FIG. 1, according to one or more aspects of the present disclosure.

FIG. 3 illustrates a top view of the IC chip 200, which includes the substrate 100 and the interconnect structure 150 disposed on the substrate 100. As shown in FIG. 3, the interconnect structure 150 covers various regions of the substrate 100 and includes various portions vertically (i.e., along the Z direction) corresponding to various regions of the substrate 100. These various portions of the interconnect structure 150 will be described in more detail below. For example, the portion of the interconnect structure 150 directly over the device region 102 will be described in more details in a fragmentary cross-sectional view in FIG. 4, which is taken along line A-A' in FIG. 3. A first square region 160 that vertically covers the fourth outer corner area 110-4, a portion of the outer ring 108 and a portion of the fourth inner corner area 106-4 is illustrated in FIG. 5. FIGS. 6 and 7 illustrate cross-sectional views across different parts in the first square region 160. A second square region 180 that vertically covers the fourth inner corner area 106-4, a portion of the inner ring 104, and a portion of the device region 102 is illustrated in FIG. 8. FIGS. 9 and 10 illustrate cross-sectional views across different parts in the second square region 180. According to the present disclosure, the first square region 160 and/or the second square region 180 may include a stress absorption zone where dummy metal bars are intentionally omitted. Due to the omission of the dummy metal bars, the stress absorption zone has a smaller pattern density. At the same time, the smaller pattern density provides the stress absorption zone with ability to absorb stress generated during subsequent processes, such as a singulation process.

Figure 4:
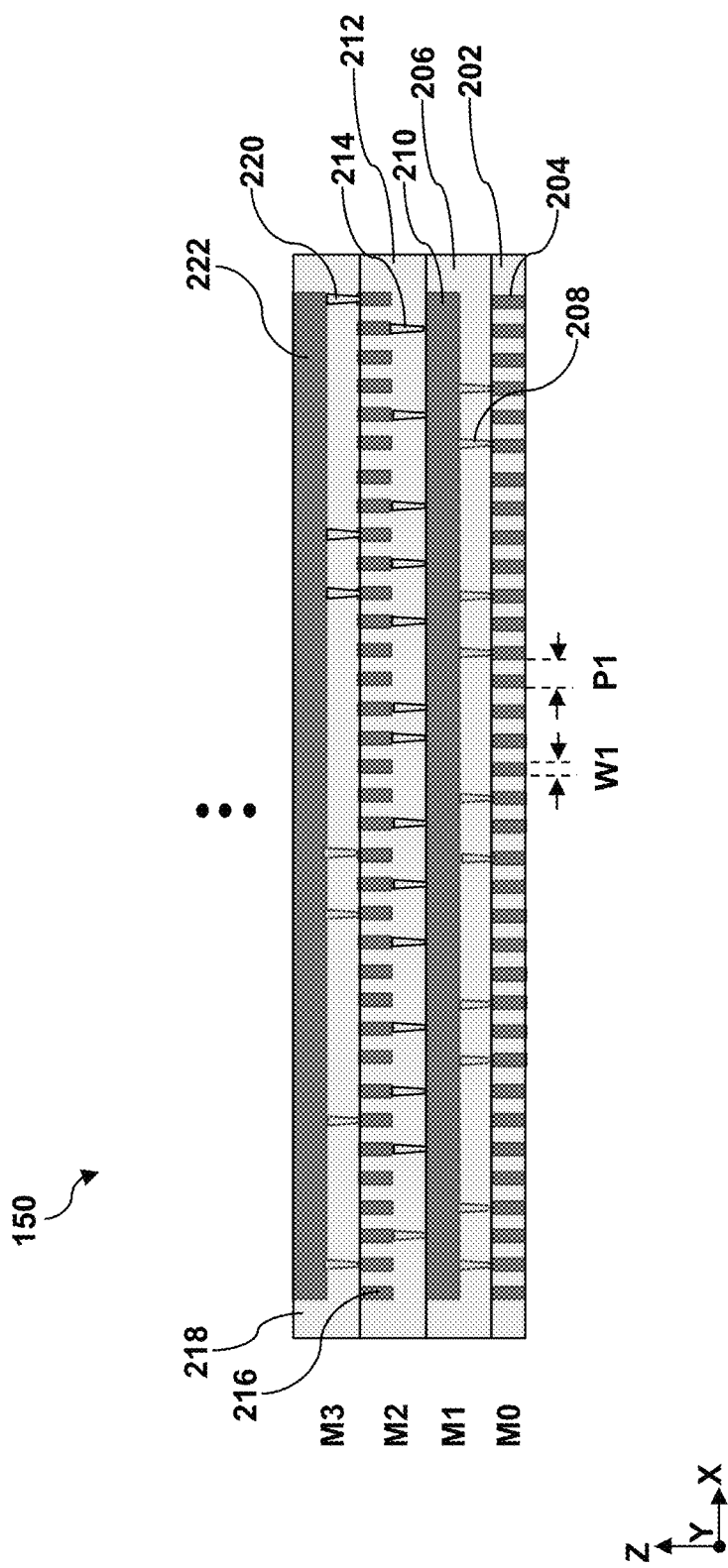
FIG. 4 illustrates an enlarged fragmentary cross-sectional view of a portion of the interconnect structure disposed over a device region of the substrate in FIG. 1, according to one or more aspects of the present disclosure.

FIG. 4 illustrates a fragmentary cross-sectional view of a portion of the interconnect structure 150 directly over the device region 102. For ease of illustration, FIG. 4 only shows the first four metal layers of the interconnect structure 150. The first four metal layers are the metal layer closest to the substrate 100 and include a first metal layer M0, a second metal layer M1, a third metal layer M2, and a fourth metal layer M3. In some embodiments, the metal layers above the fourth metal layer M3 may have dimensions much greater than those of the fourth metal layer M3. As shown in FIG. 4, the first metal layer M0 includes a first intermetal dielectric (IMD) layer 202 and first metal lines 204 embedded in the first IMD layer 202. The second metal layer M1 includes a second IMD layer 206 and second metal lines 210 embedded in the second IMD layer 206. The second metal lines 210 extend lengthwise along the X direction. Each of the second metal lines 210 is electrically coupled to selected first metal lines 204 in the first metal layer M0 by first contact vias 208, which is also embedded in the second IMD layer 206. The third metal layer M2 includes a third IMD layer 212 and third metal lines 216 embedded in the third IMD layer 212. The third metal lines 216 extend lengthwise along the Y direction. Each of the third metal lines 216 is electrically coupled to selected second metal lines 210 in the second metal layer M1 by second contact vias 214, which is also embedded in the third IMD layer 212. The fourth metal layer M3 includes a fourth IMD layer 218 and fourth metal lines 222 embedded in the fourth IMD layer 218. The fourth metal lines 222 extend lengthwise along the X direction. Each of the fourth metal lines 222 is electrically coupled to selected third metal lines 216 in the third metal layer M2 by third contact vias 220, which is also embedded in the fourth IMD layer 218.

The first IMD layer 202, the second IMD layer 206, the third IMD layer 212, and the fourth IMD layer 218 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The first metal lines 204, the second metal lines 210, the third metal lines 216, the fourth metal line 222, the first contact vias 208, the second contact vias 214, and the third contact vias 220 may include aluminum, copper, aluminum/silicon/copper alloy, titanium, ruthenium, tungsten, metal silicide, or combinations thereof. In some embodiments, the first metal lines 204, the second metal lines 210, the third metal lines 216, the fourth metal line 222, the first contact vias 208, the second contact vias 214, and the third contact vias 220 may further include a barrier layer to prevent electro-migration. The barrier layer may include titanium nitride or tantalum nitride.

As shown in FIG. 4, in the portion of the interconnect structure 150 directly over the device region 102, metal lines in adjacent metal layers are orthogonal. For example, the first metal lines 204 and third metal lines 216 extend along the Y direction, and the second metal lines 210 and the fourth metal lines 222 extend along the X direction. In generally, metal lines disposed in metal layers further away from the substrate 100 may have greater dimension. While this trend exists in the first four metal layers, metal lines in the first four metal layers may have relatively similar dimensions. Metal lines in the fifth metal layer or the sixth metal layer may have much greater dimensions. In the depicted embodiments, the first metal lines 204 each have a first width (W1) along the X direction and are arranged at a first pitch P1. In some instances, the first width (W1) may be between about 20 nm and about 50 nm and the first pitch (P1) may be about two times of the first width (W1), between about 40 nm and about 100 nm. While the width and pitch of the second metal lines 210 are not labeled, they may be similar to the those of the first metal lines 204. As described above, metal lines in the metal layer further away from the substrate 100 have greater dimensions. For example, the tenth metal line in the tenth metal layer (M9, not explicitly shown) may have a width as large as between about 5 µm and about 6 µm.

FIG. 5 illustrates an enlarged top view of the first square region 160, which is directly over the fourth outer corner area 110-4, a corner of the outer ring 108, and a portion of the fourth inner corner area 106-4. The portion of the interconnect structure 150 directly over the outer ring 108 includes a seal ring structure that includes a plurality of seal ring walls, each of which is closed-loop structure around the device region 102. For ease of reference, with respect to the interconnect structure 150, a portion thereof directly over a region of the substrate 100 may be referred to by that region. For example, the portion of the interconnect structure 150 over the device region 102 may be referred to as the device region 102 and the portion of the interconnect structure 150 directly over the outer ring 108 may be referred to as the outer ring 108. In the depicted embodiments, the portion of the interconnect structure 150 directly over the outer ring 108 includes a first seal ring wall 1082, a second seal ring wall 1084, a third seal ring wall 1086, and a fourth seal ring wall 1088. It is noted while the outer ring 108 is shown to include four seal ring walls, it is appreciated that the outer ring 108 may include less or more seal ring walls. Each of the seal ring walls includes a plurality of metal lines in each of the metal layers. The plurality of metal lines in a seal ring wall extend substantially parallel to one another and may be viewed as sub-wall structure. As shown in FIG. 5, the parallel extending metal lines in each seal ring wall may be laterally connected by first lateral connectors 128. The first lateral connectors 128 mechanically link adjacent metal lines to provide structural reinforcement. Each of the first seal ring wall 1082, the second seal ring wall 1084, the third seal ring wall 1086, and the fourth seal ring wall 1088 may extend through more than one metal layers in the interconnect structure 150. In the embodiments represented in FIG. 4, because dimensions of metal lines in the first four metal layers are similar, the first seal ring wall 1082, the second seal ring wall 1084, the third seal ring wall 1086, and the fourth seal ring wall 1088 may vertically extend through the first four metal layers. That is, while metal lines in higher metal layers (e.g., the fifth metal layer or the sixth metal layer) may still include closed-loop metal lines that track the outer ring 108, those metal lines may not be vertically aligned with any of the first seal ring wall 1082, the second seal ring wall 1084, the third seal ring wall 1086, and the fourth seal ring wall 1088.

Reference is still made to FIG. 5. The first seal ring wall 1082, the second seal ring wall 1084, the third seal ring wall 1086, and the fourth seal ring wall 1088 are not placed back to back but are intentionally spaced apart from one another. As described above, the metal lines in the interconnect structure are disposed in IMD layers and when pattern density (i.e., density of metal lines) is low in a local region, uneven surface or dishing may be resulted during a surface planarization process. In order to prevent dishing, dummy metal bars may be inserted. In the depicted embodiments, a first plurality of dummy metal bars 1182 are inserted between the first seal ring wall 1082 and the second seal ring wall 1084; a second plurality of dummy metal bars 1184 are inserted between the second seal ring wall 1084 and the third seal ring walls 1086; and a third plurality of dummy metal bars 1186 are inserted between the third seal ring wall 1086 and the fourth seal ring wall 1088. In some embodiments represented in FIG. 5, the dummy metal bars are strategically omitted from the corner of the outer ring 108 to form a first stress absorption zone 108C. Because the outer ring 108 is substantially rectangular and has four corners, the IC chip 200 of the present disclosure may include 4 first stress absorption zones 108C. The first stress absorption zone 108C includes a first gap 122 between the first seal ring wall 1082 and the second seal ring wall 1084, a second gap 124 between the second seal ring wall 1084 and the third seal ring wall 1086, and a third gap 126 between the third seal ring wall 1086 and the fourth seal ring wall 1088. Each of the first gap 122, the second gap 124, and the third gap 126 are referred to as gaps because they are free of metal lines or dummy metal bars. Each of the first gap 122, the second gap 124, and the third gap 126 includes IMD layers. In the depicted embodiments, each of the first gap 122, the second gap 124, and the third gap 126 may include the first IMD layer 202, the second IMD layer 206, the third IMD layer 212, and the fourth IMD layer 218.

FIG. 6 illustrates a fragmentary cross-sectional view of the portion of the interconnect structure directly over the outer ring 108 along line B-B' in FIG. 5. While FIG. 6 illustrates the first four metal layers like FIG. 4, the metal lines directly over the outer ring 108 are wider and are disposed at a larger pitch than those directly over the device region 102. As shown in FIG. 6, the first metal layer M0 includes the first IMD layer 202 and first ring metal lines 304 embedded in the first IMD layer 202. The second metal layer M1 includes the second IMD layer 206 and second ring metal lines 310 embedded in the second IMD layer 206. The third metal layer M2 includes the third IMD layer 212 and third ring metal lines 316 embedded in the third IMD layer 212. The fourth metal layer M3 includes the fourth IMD layer 218 and the fourth ring metal lines 322 embedded in the fourth IMD layer 218.

The portion of the interconnect structure directly over the outer ring 108 further include via bars that vertically couple metal lines in each of the seal ring walls. The first seal ring wall 1082 includes first via bars 308 embedded in the second IMD layer 206, second via bars 314 embedded in the third IMD layer 212, and third via bars 320 embedded in the fourth IMD layer 218. The via bars are different from metal lines and contact vias. The vias bars are different from metal lines because they are narrower to ensure satisfactory landing on an underlying metal line. The via bars are different from contact vias because via bars are closed-loop rings that go around the device region 102 while contact vias resemble vertical cones or pillars. Contact vias may be present in the portion of the interconnect structure directly over the outer ring 108. For example, fourth contact vias 306 may be present in the second IMD layer 206, fifth contact vias 312 may be present in the third IMD layer 212, and sixth contact vias 318 may be present in the fourth IMD layer 218.

As shown in FIG. 6, the ring metal lines and via bars may be vertically aligned to define the seal ring wall surfaces. With respect to the first seal ring wall 1082, the outermost ones of the ring metal lines 304, 310, 316, and 322 are vertically aligned with outermost ones of the via bars 308, 314 and 320 to define an outer wall surface 1082O adjacent the first plurality of dummy metal bars 1182. The innermost ones of the ring metal lines 304, 310, 316, and 322 are vertically aligned with innermost ones of the via bars 308, 314 and 320 to define an inner wall surface 1082I. For avoidance of doubts, the outer wall surface 1082O and the inner wall surface 1082I are continuous and seamless as each of the ring metal lines and via bars goes a full circle to have a closed-loop shape. The same applies to the second seal ring wall 1084, the third seal ring wall 1086, and the fourth seal ring 1088. That is, each of the second seal ring wall 1084, the third seal ring wall 1086, and the fourth seal ring 1088 has an outer wall surface and an inner wall surface defined by the ring metal lines and via bars that are substantially vertically aligned with the ring metal lines.

In the depicted embodiments, the first plurality of dummy metal bars 1182 have more dummy metal bars than the second plurality of dummy metal bars 1184 and the third plurality of dummy metal bars 1186. In some instances, the first plurality of dummy metal bars 1182 include 5 dummy metal bars in each of the first four metal layers, the second plurality of dummy metal bars 1184 include 1 dummy metal bar in each of the first four metal layers, and the third plurality of dummy metal bars 1186 include 1 dummy metal bar in each of the first fourth metal layers. These differences are not trivial. In the depicted embodiments, all structures outside the first plurality of dummy metal bars 1182 (i.e., the second seal ring wall 1084, the third seal ring wall 1086, the fourth seal ring wall 1088, the second plurality of dummy metal bars 1184, and the third plurality of dummy metal bars 1186) are sacrificial structures. During a singulation process where the IC chip 200 is singulated along a scribe line near the fourth seal ring wall 1088, if the sacrificial structures sustain substantial damages, the generated stress may be absorbed by the deformation or breakage of the first plurality of dummy metal bars 1182, which are structurally weaker than any of the seal ring walls with continuous wall surfaces. When the IC chip 200 only sustains minor damages, the stress may be damped by the second plurality of dummy metal bars 1184 and the third plurality of dummy metal bars 1186.

The ring metal lines in the portion of the interconnect structure 150 over the outer ring 108 are much wider than the metal lines directly over the device region 102. In the depicted embodiments, each of the first ring metal line 304 has a second width W2 and the first ring metal lines 304 are disposed at a second pitch P2. In some embodiments, a ratio of the second width W2 to the first width W1 is between about 5 and about 15 and a ratio of the second pitch P2 to the first pitch P1 is between about 5 and about 15. In some instances, the second width W2 may be between about 100 nm and about 250 nm and the second pitch P2 may be between about 200 nm and about 500 nm. To ensure that the via bars may satisfactorily land on the underlying ring metal lines, a third width W3 of the via bars may be between about 50% and about 80% of the second width W2. Due to the shape of the contact via and limitations of the patterning method, a fourth width W4 of the contact via (such as the fourth contact via 306, the fifth contact via 312, or the sixth contact via 318) may be between about 10% and about 30% of the second width W2. Each of the dummy metal bars in the first plurality of dummy metal bars 1182, the second plurality of dummy metal bars 1184 and the third plurality dummy metal bars 1186 may have a dummy bar width, which may be between about 50% and about 80% of the second width W2. While the dummy bars are implemented to enhance pattern density, it is observed that when a density of metal features in a metal layer is too high, the workpiece may warp. For that reason, the dummy metal bars are intentionally made narrower than the metal lines.

FIG. 7 illustrates a fragmentary cross-sectional view of the portion of the interconnect structure directly over the outer ring 108 along line C-C' in FIG. 5. Reference is briefly made to FIG. 5. Line C-C' and the X direction form an angle θ, which is 45° in the depicted embodiments. Each of the first seal ring wall 1082, the second seal ring wall 1084, the third seal ring wall 1086, and the fourth seal ring wall 1088 includes a segment that is perpendicular to line C-C'. Line C-C' passes through the first stress absorption zone 108C. As shown in FIG. 7, the first seal ring wall 1082 is spaced apart from the second seal ring wall 1084 by the first gap 122; the second seal ring wall 1084 is spaced apart from the third seal ring wall 1086 by the second gap 124; and the third seal ring wall 1086 is spaced apart from the fourth seal ring wall 1088 by the third gap 126. As described above, the first gap 122, the second gap 124, and the third gap 126 are areas where the ring metal lines or dummy metal bars are completely omitted. The first gap 122, the second gap 124 and the third gap 126 are filled with the first IMD layer 202, the second IMD layer 206, the third IMD layer 212, and the fourth IMD layer 218. The first gap 122 has a first gap width G1, the second gap 124 has a second gap width G2, and the third gap 126 has a third gap width G3. In some embodiments, the first gap width G1, which accommodates more dummy metal bars, is greater than the second gap width G2 and the third gap width G3. In some implementations, each of the first gap width G1, the second gap width G2 and the third gap width G3 may be between 300 nm and about 2000 nm (i.e., 2 μm), with the first gap width G1 being the greatest. In one embodiment, the first gap width G1 is about 1800 nm, the second gap width G2 is about 500 nm, and the third gap width G3 is about 500 nm. The width range of the first gap 122, the second gap 124, and the third gap 126 is not trivial. When the gap width is smaller than 300 nm, the benefit of such a gap is insignificant because such a gap width is too much similar to the second pitch P2. When the gap width is greater than 2000 nm, dishing at such a gap may become too significant such that its adverse effect may outweigh its benefit.

Experimental results show that the implementation of the first stress absorption zone 108C in the interconnect structure 150 over corners of the outer ring 108 provide satisfactory stress absorption without suffering the adverse effect of reduced pattern density. There are several factors that come into play. First, it has been observed that the stress during singulation process is largest around corners of the IC chip 200. The first stress absorption zone 108C, being disposed around the corners, is therefore suitably situated to absorb stress at its greatest. Second, the corners are farther away from the device region 102 or the portion of the interconnect structure 150 over the device region 102. As a result, when the first stress absorption zone 108C is implemented, the dishing or uneven surfaces are formed at locations farther away from the semiconductor devices, which minimizes the adverse effect brought about by the first stress absorption zone 108C. It can be appreciated that the boundary of the first gap 122, the second gap 124 and the third gap 126 may extend more or less into the edge portions extending along the X direction or the Y direction, increasing the lengths of the respective gap around the IC chip 200. The length of the respective gap may be adjusted to better balance the stress absorption and the desired pattern density.

In some embodiments where further stress absorption is desired, a second stress absorption zone may be implemented in the portion of the interconnect structure 150 directly over the inner ring 104. FIG. 8 illustrates an enlarged top view of the second square region 180, which is directly over the fourth inner corner area 106-4, a corner of the inner ring 104, and a portion of the device region 102. For ease of reference, with respect to the interconnect structure 150, a portion thereof directly over a region of the substrate 100 may be referred to by that region. For example, the portion of the interconnect structure 150 over the device region 102 may be referred to as the device region 102 and the portion of the interconnect structure 150 directly over the inner ring 104 may be referred to as the inner ring 104. Like the outer ring 108, the inner ring 104 is a seal ring structure that includes a plurality of seal ring walls, each of which is closed-loop structure around the device region 102. In some embodiments presented in FIG. 8, the inner ring 104 includes a fifth seal ring wall 1042 and a sixth seal ring wall 1044. It is noted while the inner ring 104 is shown to include two seal ring walls, it is appreciated that the inner ring 104 may include less or more seal ring walls. Each of the seal ring walls includes a plurality of metal lines in each of the metal layers. The plurality of metal lines in a seal ring wall extend substantially parallel to one another and may be viewed as sub-wall structure. As shown in FIG. 8, the parallel extending metal lines in each seal ring wall may be laterally connected by second lateral connectors 130. The second lateral connectors 130 mechanically link adjacent metal lines to provide structural reinforcement. Each of the fifth seal ring wall 1042 and the sixth seal ring wall 1044 may extend through more than one metal layers in the interconnect structure 150. In the embodiments represented in FIG. 8, because dimensions of metal lines in the first four metal layers are similar, the fifth seal ring wall 1042 and the sixth seal ring wall 1044 may vertically extend through the first four metal layers. That is, while metal lines in higher metal layers (e.g., the fifth metal layer or the sixth metal layer) may still include closed-loop metal lines that track the inner ring 104, those metal lines may not be vertically aligned with any of the fifth seal ring wall 1042 or the sixth seal ring wall 1044.

Reference is still made to FIG. 8. The fifth seal ring wall 1042 and the sixth seal ring wall 1044 are not arranged back to back but are intentionally spaced apart from one another. As described above, the metal lines in the interconnect structure are disposed in IMD layers and when pattern density (i.e., density of metal lines) is low in a local region, uneven surface or dishing may be resulted during a surface planarization process. In order to prevent dishing, dummy metal bars may be inserted. In the depicted embodiments, a fourth plurality of dummy metal bars 1142 are inserted between the fifth seal ring wall 1042 and the sixth seal ring wall 1044. In some embodiments represented in FIG. 8, the dummy metal bars are strategically omitted from the corner of the inner ring 104 to form a second stress absorption zone 104C. Because the inner ring 104 is substantially rectangular and has four corners, the IC chip 200 of the present disclosure may include 4 second stress absorption zones 104C. The second stress absorption zone 104C includes a fourth gap 132 between the fifth seal ring wall 1042 and the sixth seal ring wall 1044. The fourth gap 132 is referred to as a gap because it is free of metal lines or dummy metal bars. The fourth gap 132 still includes IMD layers. In the depicted embodiments, the fourth gap 132 may include the first IMD layer 202, the second IMD layer 206, the third IMD layer 212, and the fourth IMD layer 218.

FIG. 9 illustrates a fragmentary cross-sectional view of the portion of the interconnect structure 150 directly over the inner ring 104 along line D-D' in FIG. 8. While FIG. 9 illustrates the first four metal layers like FIG. 4, the metal lines directly over the inner ring 104 are wider and are disposed at a larger pitch than those directly over the device region 102. As shown in FIG. 9, the first metal layer M0 includes the first IMD layer 202 and fifth ring metal lines 404 embedded in the first IMD layer 202. The second metal layer M1 includes the second IMD layer 206 and sixth ring metal lines 410 embedded in the second IMD layer 206. The third metal layer M2 includes the third IMD layer 212 and seventh ring metal lines 416 embedded in the third IMD layer 212. The fourth metal layer M3 includes the fourth IMD layer 218 and the eighth ring metal lines 422 embedded in the fourth IMD layer 218.

The portion of the interconnect structure directly over the inner ring 104 further include via bars that vertically couple ring metal lines in each of the seal ring walls. The fifth seal ring wall 1042 includes fourth via bars 408 embedded in the second IMD layer 206, fifth via bars 414 embedded in the third IMD layer 212, and sixth via bars 420 embedded in the fourth IMD layer 218. The via bars are different from metal lines and contact vias. The vias bars are different from metal lines because they are narrower to ensure satisfactory landing on an underlying metal line. The via bars are different from contact vias because via bars are closed-loop rings that go around the device region 102 while contact vias resemble vertical cones or pillars. Contact vias may be present in the portion of the interconnect structure directly over the inner ring 104. For example, seventh contact vias 406 may be present in the second IMD layer 206, eighth contact vias 412 may be present in the third IMD layer 212, and ninth contact vias 418 may be present in the fourth IMD layer 218.

As shown in FIG. 9, the ring metal lines and via bars may be vertically aligned to define the seal ring wall surfaces. With respect to the fifth seal ring wall 1042, the outermost ones of the ring metal lines 404, 410, 416, and 422 are vertically aligned with outermost ones of the via bars 408, 414 and 420 to define an outer wall surface 10420 adjacent the fourth plurality of dummy metal bars 1142. The innermost ones of the ring metal lines 404, 410, 416, and 422 are vertically aligned with innermost ones of the via bars 408, 414 and 420 to define an inner wall surface 10421. For avoidance of doubts, the outer wall surface 10420 and the inner wall surface 10421 are continuous and seamless as each of the ring metal lines and via bars goes a full circle to have a closed-loop shape. The same applies to the sixth seal ring wall 1044. That is, the sixth seal ring 1044 has an outer wall surface and an inner wall surface defined by the ring metal lines and via bars that are substantially vertically aligned with the ring metal lines.

The ring metal lines in the portion of the interconnect structure 150 over the inner ring 104 are much wider than the metal lines directly over the device region 102. In the depicted embodiments, each of the fifth ring metal line 404 has a fifth width W5 and the fifth ring metal lines 404 are disposed at a fifth pitch P5. In some embodiments, a ratio of the fifth width W5 to the first width W1 is between about 5 and about 15 and a ratio of the fifth pitch P5 to the first pitch P1 is between about 5 and about 15. In some instances, the fifth width W5 may be between about 100 nm and about 250 nm and the fifth pitch P5 may be between about 200 nm and about 500 nm. To ensure that the via bars may satisfactorily land on the underlying ring metal lines, a width of the via bars (i.e., fourth via bars 408, fifth via bars 414 and sixth via bars 420) may be between about 50% and about 80% of the fifth width W5. Due to the shape of the contact via and limitations of the patterning method, a width of the contact via (i.e., as the seventh contact via 406, the eighth contact via 412, or the ninth contact via 418) may be between about 10% and about 30% of the fifth width W5. In one embodiment, the fifth width W5 is the same as the second width W2 and the fifth pitch P5 is the same as the second pitch P2.

FIG. 10 illustrates a fragmentary cross-sectional view of the portion of the interconnect structure directly over the inner ring 104 along line E-E' in FIG. 8. Reference is briefly made to FIG. 8. Line E-E' and the X direction form an angle θ, which is 45° in the depicted embodiments. Each of the fifth seal ring wall 1042 and the sixth seal ring wall 1044 includes a segment that is perpendicular to line E-E'. Line E-E' passes through the second stress absorption zone 104C. As shown in FIG. 10, the fifth seal ring wall 1042 is spaced apart from the sixth seal ring wall 1044 by the fourth gap 132. As described above, the fourth gap 132 is an area where the ring metal lines or dummy metal bars are completely omitted. The fourth gap 132 is filled with the first IMD layer 202, the second IMD layer 206, the third IMD layer 212, and the fourth IMD layer 218. As shown in FIG. 10, the fourth gap 132 has a fourth gap width G4. In some implementations, the fourth gap width G4 may be between 300 nm and about 2000 nm (i.e., 2 μm). The width range of the fourth gap 132 is not trivial. When the gap width is smaller than 300 nm, the benefit of such a gap is insignificant because such a gap width is too much similar to the fifth pitch P5. When the gap width is greater than 2000 nm, dishing at such a gap may become too significant such that its adverse effect may outweigh its benefit.

Experimental results show that the implementation of the second stress absorption zone 104C in the interconnect structure 150 over corners of the inner ring 104 provide satisfactory stress absorption without suffering the adverse effect of reduced pattern density. There are several factors that come into play. First, it has been observed that the stress during singulation process is largest around corners of the IC chip 200. The second stress absorption zone 104C, being disposed closer to the corners than the device region 102, is therefore suitably situated to absorb stress before the stress starts to affect the device region 102. Second, the corners are farther away from the device region 102 or the portion of the interconnect structure 150 over the device region 102. As a result, when the second stress absorption zone 104C is implemented, the dishing or uneven surfaces are formed at locations farther away from the semiconductor devices, which minimizes the adverse effect brought about by the second stress absorption zone 104C. Because the second stress absorption zone 104C is closer to the device region 102 or the portion of the interconnect structure 150 over the device region 102, the pattern density in the second stress absorption zone 104C is greater than that in the first stress absorption zone 108C. This is to ensure that the implementation of the second stress absorption zone 104C does not adversely affect the device region 102. For similar reasons, the fourth gap width G4 may be smaller than the second gap width G2 and the third gap width G3. In some alternative embodiments, the second stress absorption zone 104C may be omitted entirely.

In one exemplary aspect, the present disclosure is directed to an integrated circuit (IC) chip. The IC chip includes a substrate and a first interconnect layer over the substrate and including a first device region and a first ring region surrounding the first device region. The first ring region includes a first wall fully surrounding the first device region, and a second wall fully surrounding the first device region and the first wall. The first wall is spaced apart from the second wall by a first intermetal dielectric layer and at least one first dummy metal line along an edge of the first device region. The first wall is spaced apart from the second wall only by the first intermetal dielectric layer around a corner of the first device region.

In some embodiments, the first wall includes a first plurality of metal lines that fully surround the first device region and the second wall includes a second plurality of metal lines that fully surround the first wall. In some instances, the first plurality of metal lines are laterally connected by a first plurality of lateral connectors and the second plurality of metal lines are laterally connected by a second plurality of lateral connectors. In some implementations, the IC chip further includes a second interconnect layer over the first interconnect layer and including a second device region and a second ring region surrounding the second device region. The second ring region includes a third wall fully surrounding the second device region, and a fourth wall fully surrounding the second device region and the third wall. The third wall is spaced apart from the fourth wall by a second intermetal dielectric layer and at least one second dummy metal line along an edge of the second device region. The third wall is spaced apart from the fourth wall only by the second intermetal dielectric layer around a corner of the second device region. In some embodiments, the second device region is disposed directly over the first device region; the second ring region is disposed directly over the first ring region; the third wall is disposed directly over the first wall; and the fourth wall is disposed directly over the second wall. In some implementations, the third wall includes a third plurality of metal lines that fully surround the second device region and the fourth wall includes a fourth plurality of metal lines that fully surround the third wall. In some instances, the first plurality of metal lines include a first metal line adjacent the first device region and a second metal line adjacent the second wall, the third plurality of metal lines include a third metal line adjacent the second device region and a fourth metal line adjacent the fourth wall, and the third metal line is disposed directly over the first metal line and the fourth metal line is disposed directly over the second metal line. In some instances, the IC chip further includes a first via bar disposed between the first metal line and the third metal line, and a second via bar disposed between the second metal line and the fourth metal line. In some embodiments, the first via bar extends continuously around the first device region and the second via bar extends continuously around the first device region.

In another exemplary aspect, the present disclosure is directed to an IC chip. The IC chip includes an interconnect structure including a seal ring structure. The seal ring structure includes a first closed-loop wall comprising four edges and four corners, and a second closed-loop wall fully surrounding the first closed-loop wall. The first closed-loop wall is spaced apart from the second closed-loop wall by a first intermetal dielectric layer and at least one first dummy metal line along the four edges of the first closed-loop wall. The first closed-loop wall is spaced apart from the second closed-loop wall only by the first intermetal dielectric layer along the four corners of the first closed-loop wall.

In some embodiments, the first closed-loop wall includes a first plurality of metal lines extending parallel to one another and the second closed-loop wall includes a second plurality of metal lines extending parallel to one another. In some implementations, the first plurality of metal lines are laterally linked by a first plurality of lateral connectors and the second plurality of metal lines are laterally linked by a second plurality of lateral connectors. In some instances, the seal ring structure further includes a third closed-loop wall disposed directly over the first closed-loop wall and comprising four edges and four corners and a fourth closed-loop wall disposed directly over the second closed-loop wall. The third closed-loop wall is spaced apart from the fourth closed-loop wall by a second intermetal dielectric layer and at least one second dummy metal line along the four edges of the third closed-loop wall. The third closed-loop wall is spaced apart from the fourth closed-loop wall only by the second intermetal dielectric layer along the four corners of the third closed-loop wall. In some instances, the third closed-loop wall includes a third plurality of metal lines extending parallel to one another, and the fourth closed-loop wall includes a fourth plurality of metal lines extending parallel to one another. In some embodiments, the first plurality of metal lines includes a first innermost metal line and a first outermost metal line, the third plurality of metal lines includes a second innermost metal line and a second outermost metal line, and the second innermost metal line is disposed directly over the first innermost metal line and the second outermost metal line is disposed directly over the first outermost metal line. In some instances, the IC chip may further include a first via bar disposed between the second innermost metal line and the first innermost metal line and a second via bar disposed between the second outermost metal line and the first outermost metal line.

In yet another exemplary aspect, the present disclosure is directed to an IC chip. The IC chip includes a substrate and a first interconnect layer disposed on the substrate. The first interconnect layer includes a first region disposed directly over the device region, and a second region disposed directly over the ring region. The second region includes a closed rectangular loop having four corners and the second region includes four stress absorption zones at the four corners.

In some embodiments, the first region includes a first plurality of metal lines, the second region includes a second plurality of metal lines, and a ratio of a width of the second plurality of metal lines to a width of the first plurality of metal lines is between 5 and about 15. In some implementations, the first plurality of metal lines include a first pitch, the second plurality of metal lines includes a second pitch, and a ratio of the second pitch to the first pitch is between 5 and about 15. In some instances, each of the four stress absorption zones has a width equal to or greater than 2 times of the second pitch and is free of any metal line.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip, comprising:
   a substrate; and
   a first interconnect layer over the substrate and comprising a first device region and a first ring region surrounding the first device region, the first ring region comprising:
   a first wall vertically extending through the first interconnect layer and fully surrounding the first device region, and
   a second wall vertically extending through the first interconnect layer and fully surrounding the first device region and the first wall,
   wherein the first wall is spaced apart from the second wall by a first intermetal dielectric layer and at least one first dummy metal line along an edge of the first device region, wherein the first wall is spaced apart from the second wall only by the first intermetal dielectric layer around a corner of the first device region, wherein the first wall comprises a first plurality of metal lines that fully surround the first device region.

2. The IC chip of claim 1, wherein the second wall comprises a second plurality of metal lines that fully surround the first wall.

3. The IC chip of claim 2, wherein the first plurality of metal lines are laterally connected by a first plurality of lateral connectors, wherein the second plurality of metal lines are laterally connected by a second plurality of lateral connectors.

4. The IC chip of claim 2, further comprising:

a second interconnect layer over the first interconnect layer and comprising a second device region and a second ring region surrounding the second device region, the second ring region comprising:
  a third wall fully surrounding the second device region, and
  a fourth wall fully surrounding the second device region and the third wall, wherein the third wall is spaced apart from the fourth wall by a second intermetal dielectric layer and at least one second dummy metal line along an edge of the second device region, wherein the third wall is spaced apart from the fourth wall only by the second intermetal dielectric layer around a corner of the second device region.

5. The IC chip of claim 4, wherein the second device region is disposed directly over the first device region, wherein the second ring region is disposed directly over the first ring region, wherein the third wall is disposed directly over the first wall, and wherein the fourth wall is disposed directly over the second wall.

6. The IC chip of claim 4, wherein the third wall comprises a third plurality of metal lines that fully surround the second device region, wherein the fourth wall comprises a fourth plurality of metal lines that fully surround the third wall.

7. The IC chip of claim 6, wherein the first plurality of metal lines comprise a first metal line adjacent the first device region and a second metal line adjacent the second wall, wherein the third plurality of metal lines comprise a third metal line adjacent the second device region and a fourth metal line adjacent the fourth wall, wherein the third metal line is disposed directly over the first metal line and the fourth metal line is disposed directly over the second metal line.

8. The IC chip of claim 7, further comprising a first via bar disposed between the first metal line and the third metal line; and a second via bar disposed between the second metal line and the fourth metal line.

9. The IC chip of claim 8, wherein the first via bar extends continuously around the first device region, wherein the second via bar extends continuously around the first device region.

10. An integrated circuit (IC) chip, comprising:

an interconnect structure including a seal ring structure, the seal ring structure comprising:

a first closed-loop wall comprising four edges and four corners, and a second closed-loop wall fully surrounding the first closed-loop wall, wherein the first closed-loop wall is spaced apart from the second closed-loop wall by a first intermetal dielectric layer and at least one first dummy metal line along the four edges of the first closed-loop wall, wherein the first closed-loop wall is spaced apart from the second closed-loop wall only by the first intermetal dielectric layer along the four corners of the first closed-loop wall, wherein the first closed-loop wall and the second closed-loop wall comprise copper (Cu), titanium nitride (TiN), tungsten (W), or ruthenium (Ru).

11. The IC chip of claim 10, wherein the first closed-loop wall comprises a first plurality of metal lines extending parallel to one another, wherein the second closed-loop wall comprises a second plurality of metal lines extending parallel to one another.

12. The IC chip of claim 11, wherein the first plurality of metal lines are laterally linked by a first plurality of lateral connectors, wherein the second plurality of metal lines are laterally linked by a second plurality of lateral connectors.

13. The IC chip of claim 11, wherein the seal ring structure further comprises:

a third closed-loop wall disposed directly over the first closed-loop wall and comprising four edges and four corners; and a fourth closed-loop wall disposed directly over the second closed-loop wall, wherein the third closed-loop wall is spaced apart from the fourth closed-loop wall by a second intermetal dielectric layer and at least one second dummy metal line along the four edges of the third closed-loop wall, wherein the third closed-loop wall is spaced apart from the fourth closed-loop wall only by the second intermetal dielectric layer along the four corners of the third closed-loop wall.

14. The IC chip of claim 13, wherein the third closed-loop wall comprises a third plurality of metal lines extending parallel to one another, and wherein the fourth closed-loop wall comprises a fourth plurality of metal lines extending parallel to one another.

15. The IC chip of claim 14, wherein the first plurality of metal lines comprise a first innermost metal line and a first outermost metal line, wherein the third plurality of metal lines comprise a second innermost metal line and a second outermost metal line, wherein the second innermost metal line is disposed directly over the first innermost metal line and the second outermost metal line is disposed directly over the first outermost metal line.

16. The IC chip of claim 15, further comprising a first via bar disposed between the second innermost metal line and the first innermost metal line; and a second via bar disposed between the second outermost metal line and the first outermost metal line.

17. An integrated circuit (IC) chip, comprising:

a substrate comprising:
  a device region, and
  a ring region surrounding the device region; and a first interconnect layer disposed on the substrate, the first interconnect layer comprising:
  a first region disposed directly over the device region, and
  a second region disposed directly over the ring region,
wherein the second region comprises a closed rectangular loop having four corners,
wherein the second region comprises a plurality of metal patterns disposed in a plurality of dielectric layers,
wherein at least one of the plurality of metal patterns extends continuously around the first region,
wherein the second region comprises four stress absorption zones at the four corners,
wherein a metal pattern density outside the four stress-absorption zones is greater than a metal pattern density within the four stress-absorption zones.

18. The IC chip of claim 17,
wherein the first region comprises a first plurality of metal lines,
wherein the plurality of metal patterns of the second region comprises a second plurality of metal lines,
wherein a ratio of a width of the second plurality of metal lines to a width of the first plurality of metal lines is between 5 and about 15.

19. The IC chip of claim 18,
wherein the first plurality of metal lines comprise a first pitch,
wherein the second plurality of metal lines comprise a second pitch,
wherein a ratio of the second pitch to the first pitch is between 5 and about 15.

20. The IC chip of claim 18,
wherein the plurality of metal patterns of the second region further comprises:
  a plurality of via bars, each of the plurality of via bars interfacing at least one of the second plurality of metal lines, and
  a plurality of dummy metal bars,
wherein the four stress absorption zones are free of the plurality of dummy metal bars.

\* \* \* \* \*